United States Patent [19]
Gilbert

[11] Patent Number: 5,126,586
[45] Date of Patent: Jun. 30, 1992

[54] WIDEBAND DIFFERENTIAL VOLTAGE-TO-CURRENT CONVERTERS

[75] Inventor: Barrie Gilbert, Portland, Oreg.

[73] Assignee: Analog Devices, Inc., Norwood, Conn.

[21] Appl. No.: 523,909

[22] Filed: May 16, 1990

[51] Int. Cl.$^5$ .......................... H03K 4/00; H03K 5/22
[52] U.S. Cl. ................... 307/260; 307/494; 307/261; 328/160
[58] Field of Search .......... 330/252, 260, 261; 307/490, 491, 494, 498, 264; 328/160, 115, 172, 145; 364/841; 341/140

[56] References Cited

U.S. PATENT DOCUMENTS

| | | | |
|---|---|---|---|
| 3,544,780 | 3/1970 | Jorgensen | 307/498 |
| 4,146,844 | 3/1979 | Quinn | 330/252 |
| 4,390,848 | 6/1983 | Blauschild | 330/261 |
| 4,586,155 | 4/1986 | Gilbert | 328/160 |

Primary Examiner—Edward P. Westin
Assistant Examiner—Richard Roseen

[57] ABSTRACT

Voltage-to-Current (V-I) converters of the differential input and differential output type designed to be fabricated as an integrated circuit on a single monolithic chip. The circuit includes a first pair of resistors connected between first and second input terminals with their common node connected to the bases of a pair of NPN output transistors supplying differential output currents from their collectors. The emitters of these transistors are connected through corresponding resistors to the input terminals respectively. A capacitor is connected between the common bases and reference (ground) to establish an appropriate time constant for achieving high complementarily of the output currents. Variations on this basic circuit are disclosed for substantially eliminating input bias current and for reducing both odd and even-order distortion in the output signal.

26 Claims, 17 Drawing Sheets

WIDEBAND DIFFERENTIAL VOLTAGE-TO-CURRENT CONVERTERS

BACKGROUND OF THE INVENTION

1. Field of the Invention

This invention relates to voltage-to-current (V-I) converters formed as part of an integrated-circuit (IC) on a monolithic chip. More particularly, this invention relates to such converters of the differential-input, differential-output type.

2. Description of the Prior Art

Voltage-to-current converters are employed in a number of different products such as analog multipliers and modulators. Several well known and extensively used analog multiplier circuits are shown for example in my U.S. Pat. No. 4,586,155. The accuracy of such analog multipliers is highly dependent upon the quality of the V-I converters forming part of the circuitry.

Prior art V-I converter circuits have had serious deficiencies which have adversely affected the performance of the multipliers or other components in which they are used. For example, complementarity of the two output currents of the converter has been inadequate ("complementarity" in this context refers to the degree to which the sum of the output currents remains constant with signal variations). Some converter circuits particularly have suffered from poor high-frequency accuracy, when the two output currents become severely unbalanced. Transient response has generally not been satisfactory, and the output signals develop both low-frequency and high-frequency distortions which need to be sharply reduced to achieve the desired component performance.

SUMMARY OF THE INVENTION

In preferred embodiments of the invention to be described hereinafter in detail, novel V-I converter circuitry is utilized to provide a high degree of complementarity for the two output currents of the converter. Still other circuitry provides reduced distortion and high accuracy. In one version, static accuracy of 0.05% has been achieved, compared with an accuracy of 0.25% in previously available similar devices. Residual non-linearity has been substantially improved (in one model, to as low as 0.002%), as has the bandwidth (to several hundred MHz).

Other objects, aspects and advantages of the invention will in part be pointed out in, and in part apparent from, the following description considered together with the accompanying drawings.

DETAILED DESCRIPTION OF PREFERRED EMBODIMENTS

Figure 1:
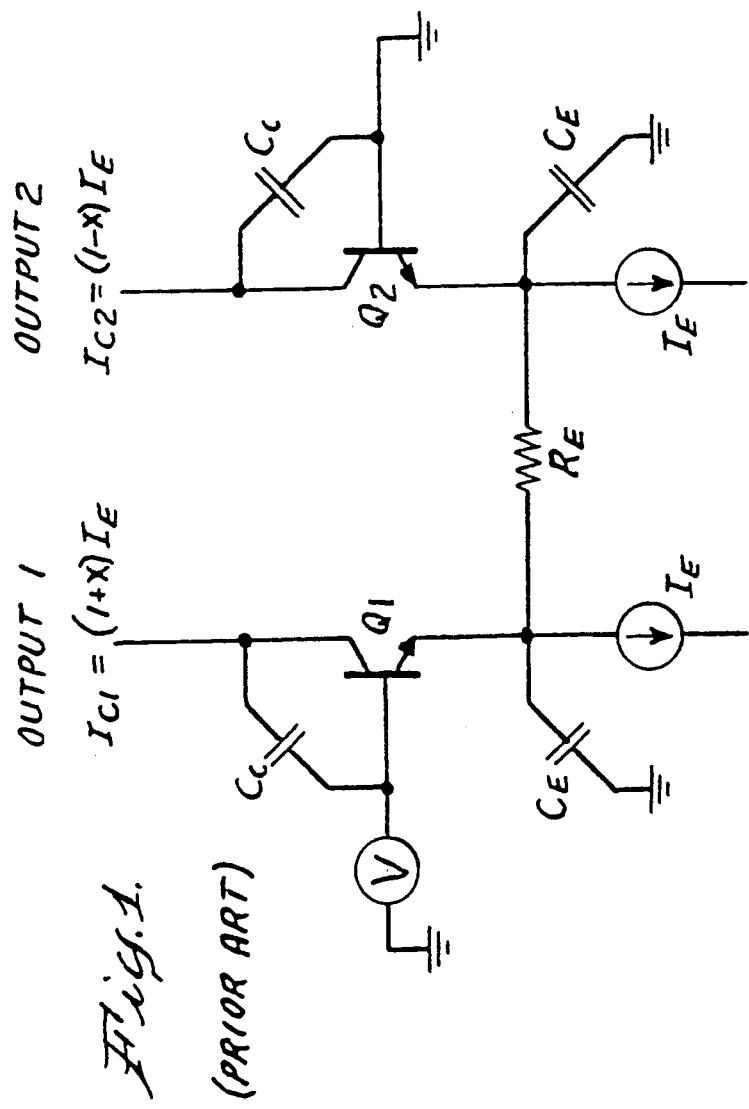
FIG. 1 is a schematic diagram illustrating a conventional prior-art V-I converter circuit.

FIG. 1 shows a basic V-I converter arrangement of a type well known in the prior art, and as shown in textbooks. See, for example, Grelene, "Bipolar and MOS Analog Integrated Circuit Design" (Wiley, 1984), p. 462. The input is shown as a single voltage, V. The inherently-balanced form of the circuit allows it to operate equally well from balanced (differential) sources of V/2 and −V/2, but in practice the circuit is required to meet all of its performance ratings in the less favorable mode of unbalanced drive, and therefore it is shown here in that format.

Significant amounts of even-order distortion can be generated in a translinear by a multiplier cell driven by a V-I converter if the multiplier input currents (i.e. the two converter outputs) are not strictly complementary, that is, if the sum of these currents is not constant with variations in the signal.

The two output currents are here shown as $I_{C1}=(1+X)I_E$ and $IC2=(1-X)I_E$, where X is a dimensionless variable in the range −1 to +1 and $I_E$ is the value of each of the bias currents to the emitter nodes. This representation highlights the essential symmetry of the circuit. Each output can vary from zero to $2I_E$.

X is called the modulation index. In designing V/I converters, the magnitude of the full-scale value of the modulation index, $X_{FS}$, which occurs at the full-scale value of the input $V_{FS}$, must be kept well below unity (its maximum possible value) to avoid odd-order distortion. It can readily be shown that, to a first approximation, $$X=V/I_E R_E \tag{1}$$

$C_C$ is the collector-base capacitance of the transistors Q1, Q2, and $C_E$ represents the total parasitic capacitance at the emitter nodes. Typically, $C_E$ is due to the collector-substrate and collector-base capacitance of the transistors (not shown) that provide the bias currents, $I_E$.

It may first be noted that the collector-base capacitance $C_C$ of Q1 causes AC feedthrough directly from the input to Output 1. This has the form, in the s-plane representation of the AC response, of a transmission zero in the right half of the plane. Considering the overall effect of this on the V/I response (but for now ignoring the emitter-node parasitic capacitances $C_E$), at low frequencies the transimpedance is determined by the resistor $R_E$, but as the reactance of $C_C$ becomes comparable with $R_E$ at higher frequencies the out-of-phase displacement current subtracts from the total signal at Output 1. Eventually, the feedthrough in the $C_C$ of Q1 dominates the HF response.

The collector-base capacitance $C_C$ of Q2 does not cause such a feedthrough problem, since the base of Q2 is at a fixed voltage, and its emitter signal current is more or less the input V (which is replicated by the emitter follower action of Q1) divided by the emitter-to-emitter resistance $R_E$. That is, Q2 is acting essentially as a current-driven grounded-base stage. Consequently, the small-signal AC response at Output 2 is quite flat up to high frequencies.

Considering the additional e the capacitance of parasitic capacitors $C_E$ on the response, Output 2 is not much altered, because $C_E$ for Q2 simply forms a pole with the re of Q2, which typically occurs at a very high frequency. However, the reactance of $C_E$ for Q1 is effectively in shunt with $R_E$, so that Output 1 exhibits rising response with frequency. Unlike that due to $C_C$, it is in-phase with the DC response. The net result is a very poor AC response and, in particular, large disparity in the HF amplitude response at the two outputs.

In practical circumstances, when $R_E$ may be several kilo-ohms or more, accurate wideband operation of the FIG. 1 circuit is severely degraded by the presence of the parasitic capacitances, particularly those at the emitter nodes, $C_E$.

In addition to poor HF response, the FIG. 1 converter circuit has several other problems:

(1) Odd-order distortion arising from the modulation of Vbe;

(2) Even-order distortion arising from the modulation of alpha (the common-base current gain $I_c I_e$) mainly due to variations in the collector-base bias voltage as the input swings through its full-scale range;

(3) The signal is "hard-limited" if driven beyond the clipping point at $V_{PK} = I_E R_E$; (Hard-limited is where a signal is stopped abrubtly when the limit value is reached, as compared to soft-limiting where a signal continues to change, but at a much reduced pace.)

(4) If the input is too positive, Q1 can go into saturation, whereupon the phase in Output 1 reverses and the input impedance falls severely; and (5) The base currents at the inputs are often several microamps, and vary quite widely over temperature.

Figure 2:
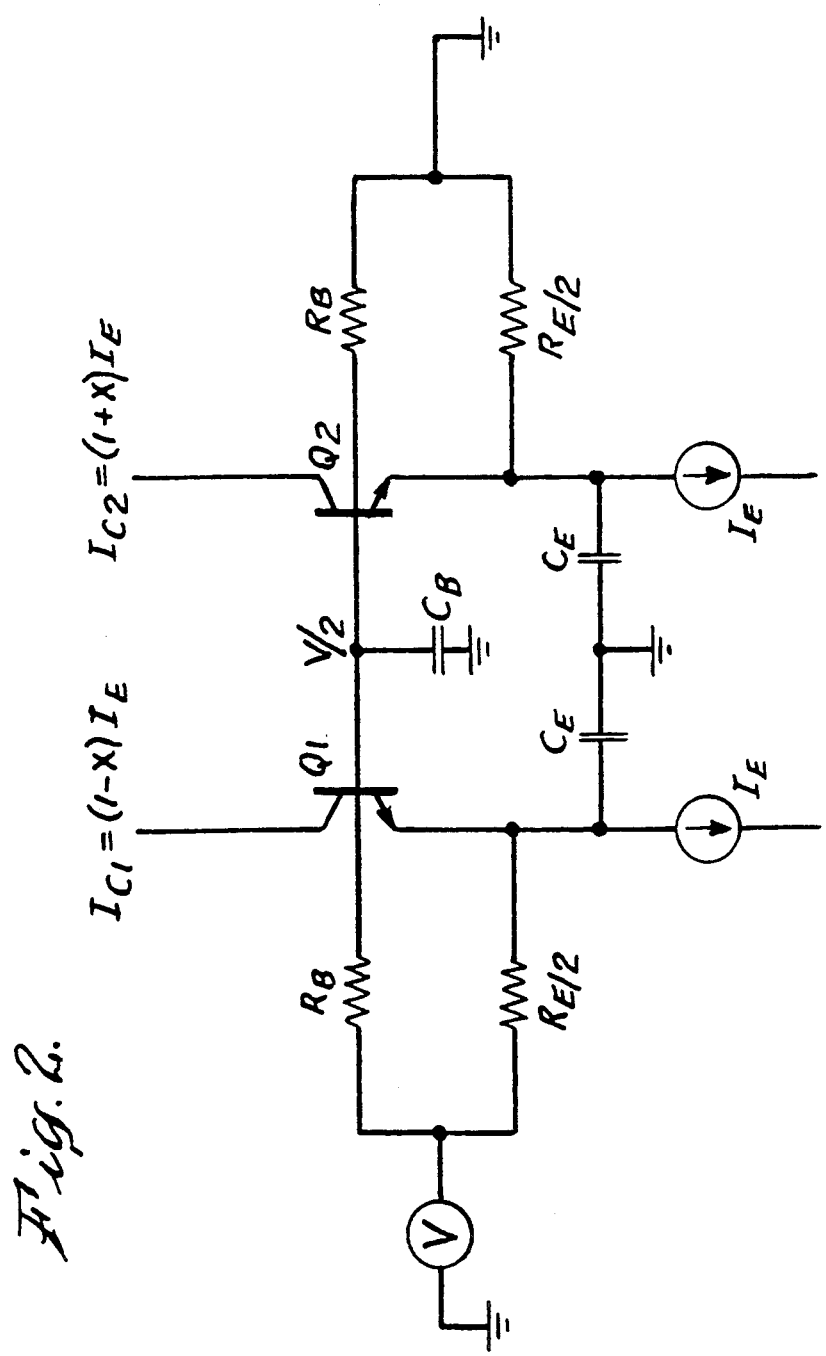
FIG. 2 is a schematic diagram showing the basic arrangement of one V-I converter in accordance with this invention.

FIG. 2 shows a V-I converter circuit arrangement which avoids many of the problems with that of FIG. 1. The only additional components used here are the resistors $R_B$ and the capacitor $C_B$ ($R_E$ has been split into two equal parts). The resistors cause half of the input V to appear at the common base node of Q1, Q2; the capacitor $C_B$ causes the pulse response at this node to be slowed down by just the right amount to cancel the effect of the emitter-node capacitances $C_E$ unavoidably associated with the current sources $I_E$, in a typical practical implementation where these currents are coming from the collectors of other transistors.

The effective transresistance is FIG. 2 is still $R_E$. The polarity of the outputs is reversed from that of FIG. 1, but that is only a matter c- system organization. The odd-order distortion caused by the modulation of Vbe is the same The even-order distortion is similar in magnitude, although the details differ slightly. Here, both Q1 and Q2 see the same change in Vcb as the input varies (assuming the invariably low-impedance collector load), so any changes in alpha affects both outputs by the same amount. The input resistance is now that of the two series-connected $R_B$'s in shunt with the (effectively) series-connected emitter resistors, each of $R_E/2$, that is, $2R_B$ in parallel with $R_E$. Using typical values of $R_E/2 = 37.5k\Omega$ and $R_B = 75k\Omega$, the input resistance is 50kΩ.

When $V = I_E R_E$, Q1 is just cut off and the current in Q2 is $2I_E$. However, for $V > I_E R_E$, the common base node continues to rise and the voltage across the right-hand $R_E/2$ likewise rises, increasing $I_{C2}$ beyond $2I_E$, without limit. Likewise, when $V < -I_E R_E$, $I_{C1}$ continues to rise. Thus, although $I_{C1}$ and $I_{C2}$ are in this state no longer complementary, the differential output ($I_{C1} - I_{C2}$) shows a "soft" limiting characteristic, which is useful in many applications of the circuit.

The input voltage V can exceed the supply voltages at the collectors. This is because the common base node moves only half as far as the input. If, for example, the internal supplies were ±12V, the input would be able to go to at least ±25V, that is, 2(12V+Vbe), before either Q1 or Q2, or one of the two current-source transistors (not shown in FIG. 6) went into saturation. Even at this extreme, the consequences would not be as severe as in the FIG. 1 circuit, due to the favorable phasing relationships between inputs and outputs. For example, just prior to Q1 going into saturation (because the common base node has risen as far as its collector voltage), its collector current was decreasing, so the voltage at its collector due to a load impedance would have been rising. After it saturates, the direction of the collector voltage change remains the same.

Advantageously, there are no junctions at the input nodes, which might turn on under overload and undesirably clamp the source, or possibly dissipate enough power to damage the IC. (In some cases, commercial production circuits have to have clamping devices, which are not necessarily simple junctions, added to the input nodes to protect the oxide against breakdown due to electrostatic discharge (ESD) events which may be experienced by the packaged part.)

It will be noted that Q1 and Q2 now operate essentially as grounded base stages, which results in substantial improvements in the small-signal AC response and the large-signal transient response. The voltage at the common base node does change, but the presence of $C_B$ slows such changes to the point where it acts almost like an AC ground for high signal frequencies.

In the FIG. 1 circuit, the displacement current in the $C_C$ of Q1 during a transient edge could be very high. Now, however, the rate of rise at the common base node with for example $R_B = 75k\Omega$, and $C_B = 2$ pF is considerably slowed, with the displacement current in $C_C$ reduced, e.g., more than 150 times lower than before. The same current, in the sample phase, flows to Output 2. Thus the differential response is not affected by $C_C$ at all, and in practice the complementarity of the two outputs is negligibly degraded.

The displacement current which now flows in the emitter-node parasitics $C_E$ restores the bandwidth lost by "slugging" the common base node. Slugging is a large change in signal supplied to an element. A simple small-signal analysis shows that the overall transfer function to Output 1 has the form $$I_1(s) = \frac{1 + s(2T_1 - T_2)}{1 + sT_1} \cdot \frac{V}{R_E} \quad (2)$$

and that to Output 2 has the form $$I_2(s) = \frac{1 + sT_2}{1 + sT_1} \cdot \frac{V}{R_E} \quad (3)$$

where $T_1 = R_B C_B/2$, that is, the time constant formed at the common-base node, and $T_2 = R_E C_E/2$. Pole-zero cancellation for both outputs occurs identically when $T_1 = T_2$, that is, by satisfying the requirement:

$$C_B R_B = R_E C_E \quad (4)$$

When this condition is satisfied, the two output currents remain exactly complementary up to very high frequencies, e.g. to 500 MHz.

From equations (2) and (3), the difference between $I_1(s)$ and $I_2(s)$ is simply $2V/R_E$, whatever the values of $T_1$ and $T_2$. That is, even with no attempt to equalize the time-constants, the differential response will be flat over frequency. No internal node ever has to slew rapidly. The common base node moves slowly through a voltage of half the input step amplitude. The absence of large-signal nonlinearities results in essentially no difference between large and small transient response. All pulse edges have very fast, balanced rise-times, no pre-shoot and negligible overshoot. The high-frequency base currents related to charging and discharging the base regions of Q1 and Q2 shuttle back and forth across the common base node; the base charge needed to turn Q2 on, say, is provided directly by that coming from the base of Q1 as it turns off.

Figure 8:
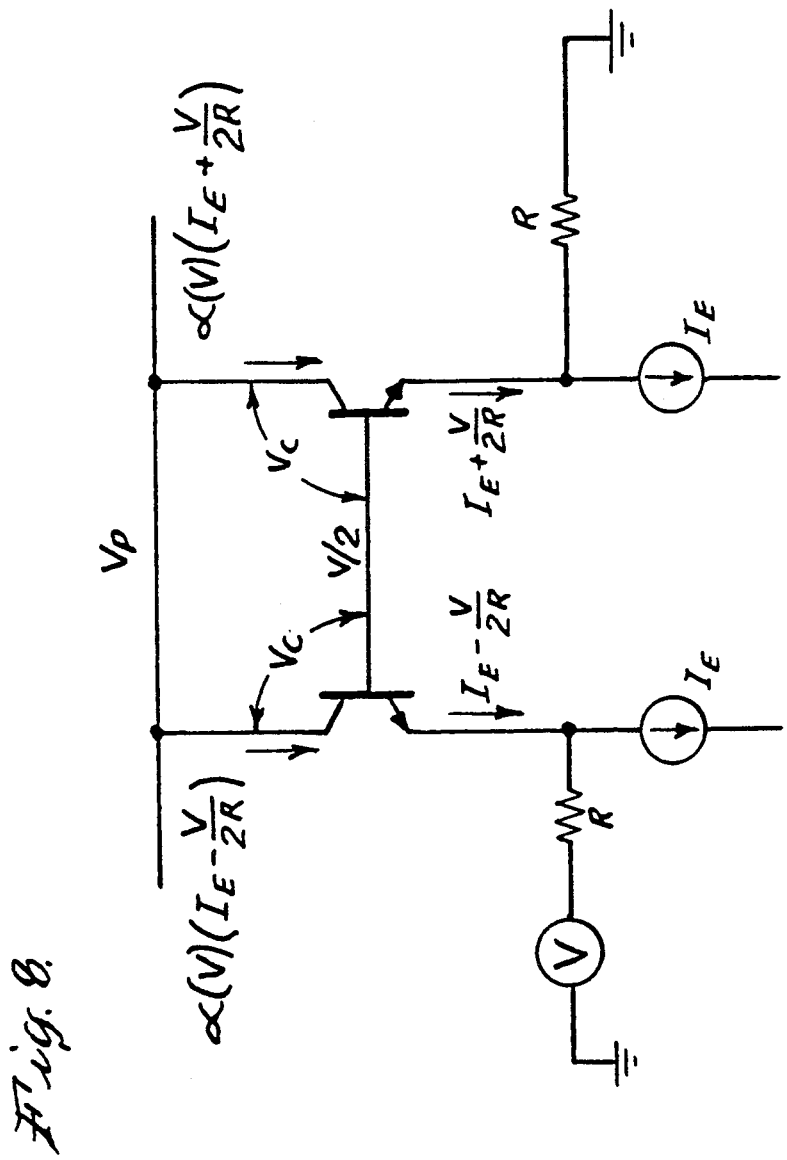
FIG. 8 shows a circuit illustrating aspects of the analysis of even-order distortion in a V-I converter.

The circuit of FIG. 2 is related to that of FIG. 8 of the above-mentioned U.S. Pat. No. 4,586,155. That FIG. 8 circuit suffers from slew-rate limitations (because of the use of input emitter followers), whereas in the FIG. 2 circuit the signal source V is connected directly to the input terminals without any intervening circuit elements. The FIG. 8 circuit has lower accuracy in the HF response to the two outputs. The addition of $C_B$ in the FIG. 2 circuit, and particularly the achievement of balanced HF response, provide substantial advantages over the prior arrangement.

Figure 3:
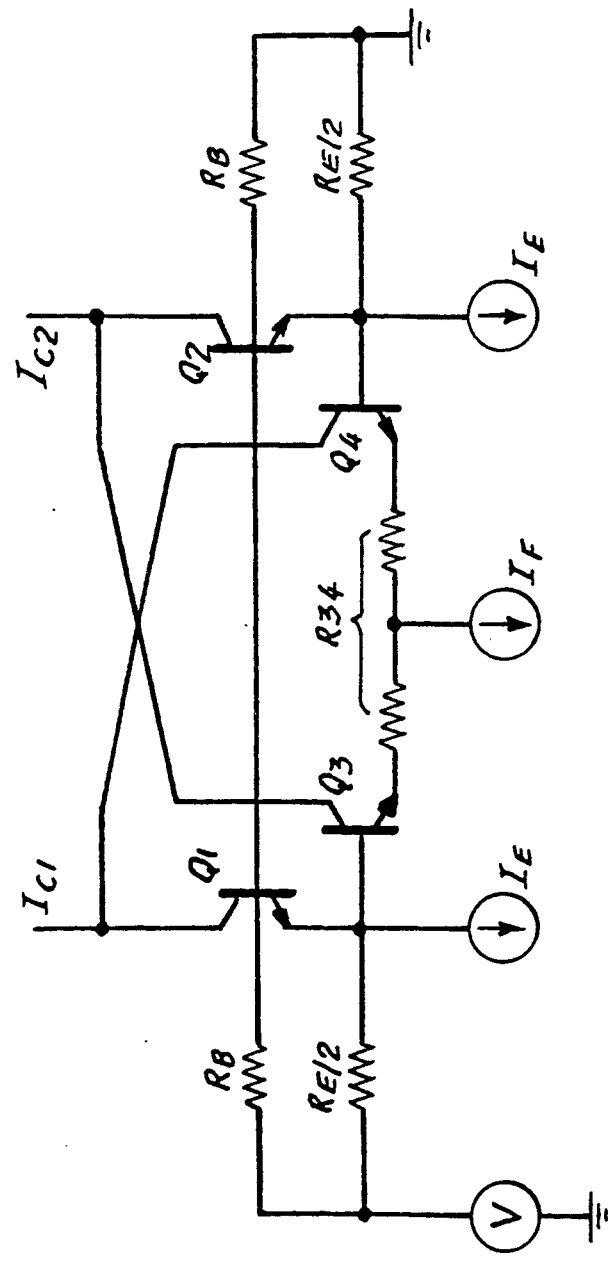
FIG. 3 shows a V-I converter circuit like that of FIG. 2, and including means to cancel odd-order distortion.

Odd-order distortion due to the variation of the Vbe's of Q1 and Q2 with signal may in some instances be troublesome. As shown in FIG. 3, a simple compensation technique can be employed with the circuit of FIG. 2. The Vbe between the emitters of Q1 and Q2 is sensed by the differential amplifiers Q3, Q4 and R34, serving as an auxiliary V/I converter which generates a differential output current proportional only to the error signal Vbe. By virtue of the cross-connected collectors, this circuitry cancels the error in the collector currents of Q1 and Q2 by supplying the signal deficit due to the Vbe. A special characteristic of this circuit is that the Vbe being sensed is not a replication of Vbe (as in the above-mentioned prior art U.S. Pat. 4,586,155), but the actual Vbe causing the nonlinearity.

Figure 4:
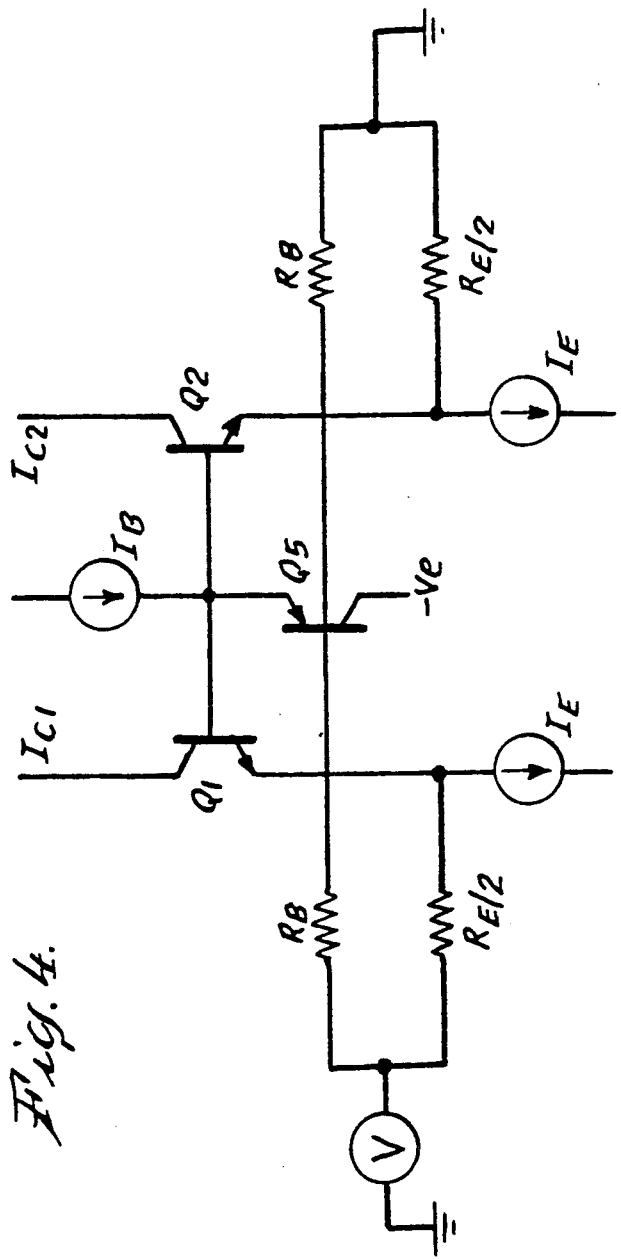
FIG. 4 shows a V-I converter circuit with means to substantially reduce input bias current.

The basic circuit of FIG. 2 has a bias path to the input, resulting in a bias current of about $2Vbe/R_E$; for typical values of Vbe=650 mV and $R_E/2 = 37.5k$ this is about 17 μA. While this may not matter in some applications (for example, when the signal source is a voltage generator), it is advantageous in some other applications to reduce the bias current to near-zero (for example, to allow the inclusion of an AC coupling capacitor while keeping the offset voltage low). As shown in FIG. 4, first-order elimination of input bias current can be achieved by inserting a PNP transistor Q5 in the circuit. This PNP couples the common-node of the resistors $R_B$ to the common base connection of Q1, Q2, whereas in FIG. 2, the resistors $R_B$ are connected directly to the bases.

The Vbe of Q5 is similar to that of Q1 and Q2, so there is almost zero voltage across the resistors $R_E/2$ when V=0, and therefore no bias current in them. By appropriate choice of the current $I_B$, and device geometries, the input bias current can be adjusted to exactly zero, by balancing the Vbe of Q5 against the Vbe's of Q1 and Q2.

It should be noted that the capacitor $C_B$ (not shown in FIG. 4) is placed at the common node of resistors $R_B$ to correctly form the time-constant $T_1$. The slowly-varying voltage at this node can readily be transferred to the common base node of Q1 and Q2 by a low-speed PNP transistor, such as a substrate PNP, if that is all that is available in the IC process, without impacting the AC or transient response. There is likewise no need to use a large value of $I_B$ with a view to achieving a high slew rate at this node.

Figure 5:
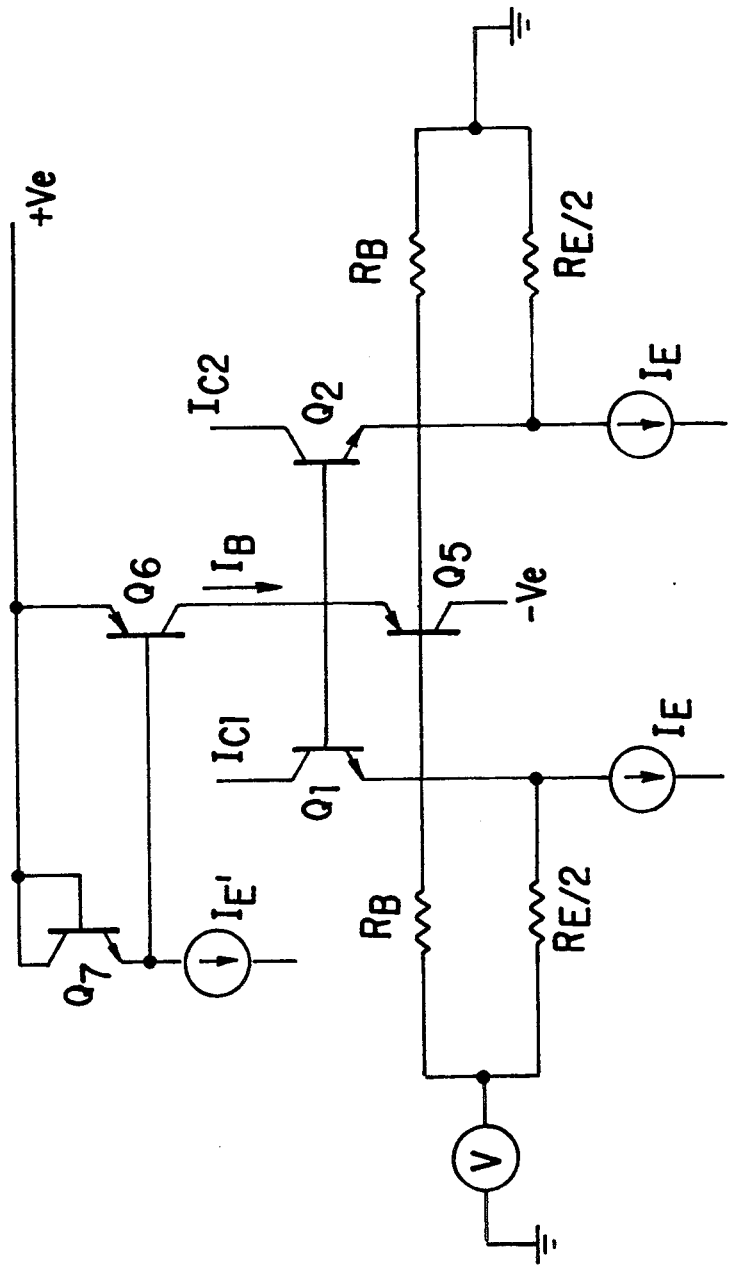
FIG. 5 shows a circuit like FIG. 4 but with a further improvement.

The Vbe of Q5 can be forced to be more closely equal to that of Q1 and Q2 (at their quiescent point, $I_E$) by using the scheme shown in FIG. 5. This circuit relies only on the matching of "like to like". That is, the Vbe of Q7, which by choice of its bias current $I_E$, can be made closely equal to that of Q1 and Q2, is impressed across the emitter-base junction of Q6 and causes some current to bias Q5 to essentially the same Vbe. Looked at another way, the two PNPs act to replicate the Vbe of Q7 (which is the same as the Vbe at Q1 or Q2) in Q5, resulting in the automatic nulling of the residual voltage across the resistors $R_E/2$ and thus of the bias current.

In practice, fairly large lot-to-lot differences in the Vbe's of PNPs versus NPNs can be expected. These would lead to large uncertainties in $I_B$. For example, a $\pm 60$ mV difference would cause $I_B$ to range from about ten times too small to ten times too great. This spread can readily be reduced by the inclusion of emitter resistors, marked with asterisks in FIG. 6. These resistors also greatly reduce errors arising from finite Early voltages in the transistors is the voltage where extrapolation of the linear portions of a bipolar transistor characteristic curves converge. Further refinements are explained hereinafter.

Figure 6:
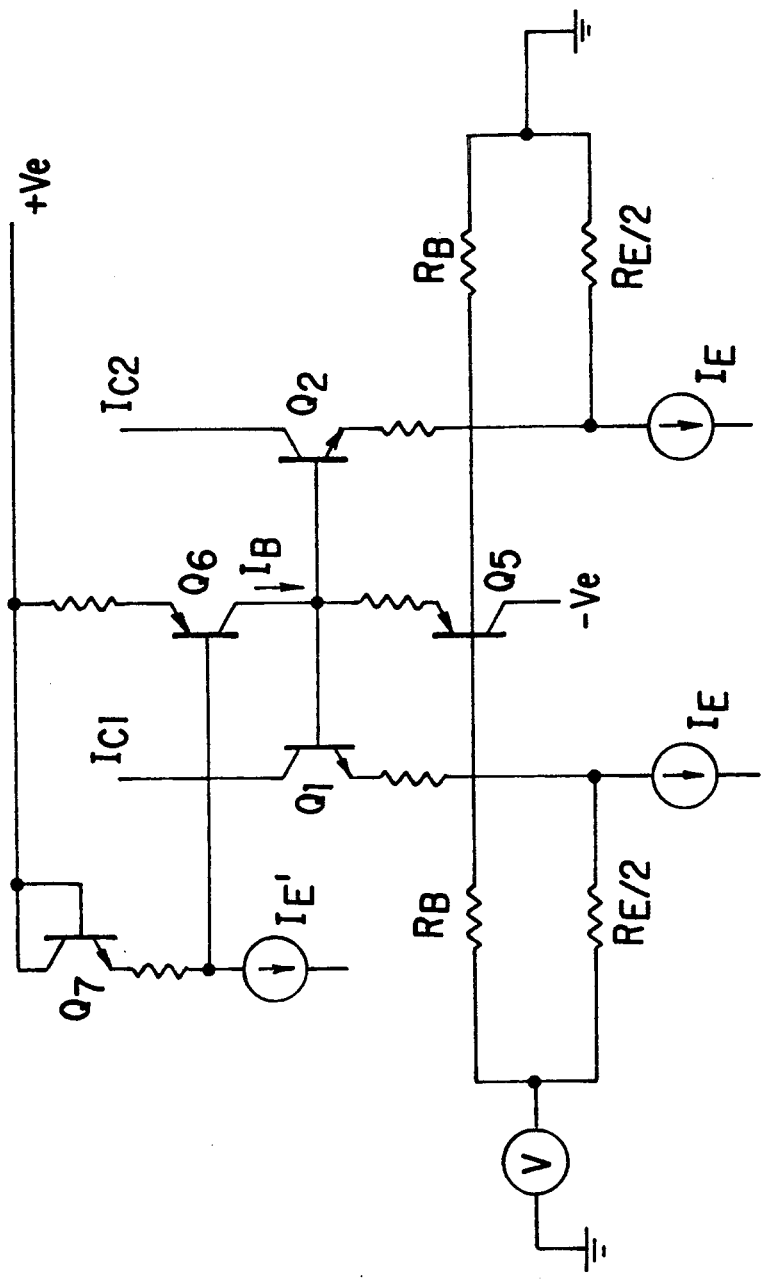
FIG. 6 shows a circuit like FIG. 5 but including emitter resistors.
Figure 7:
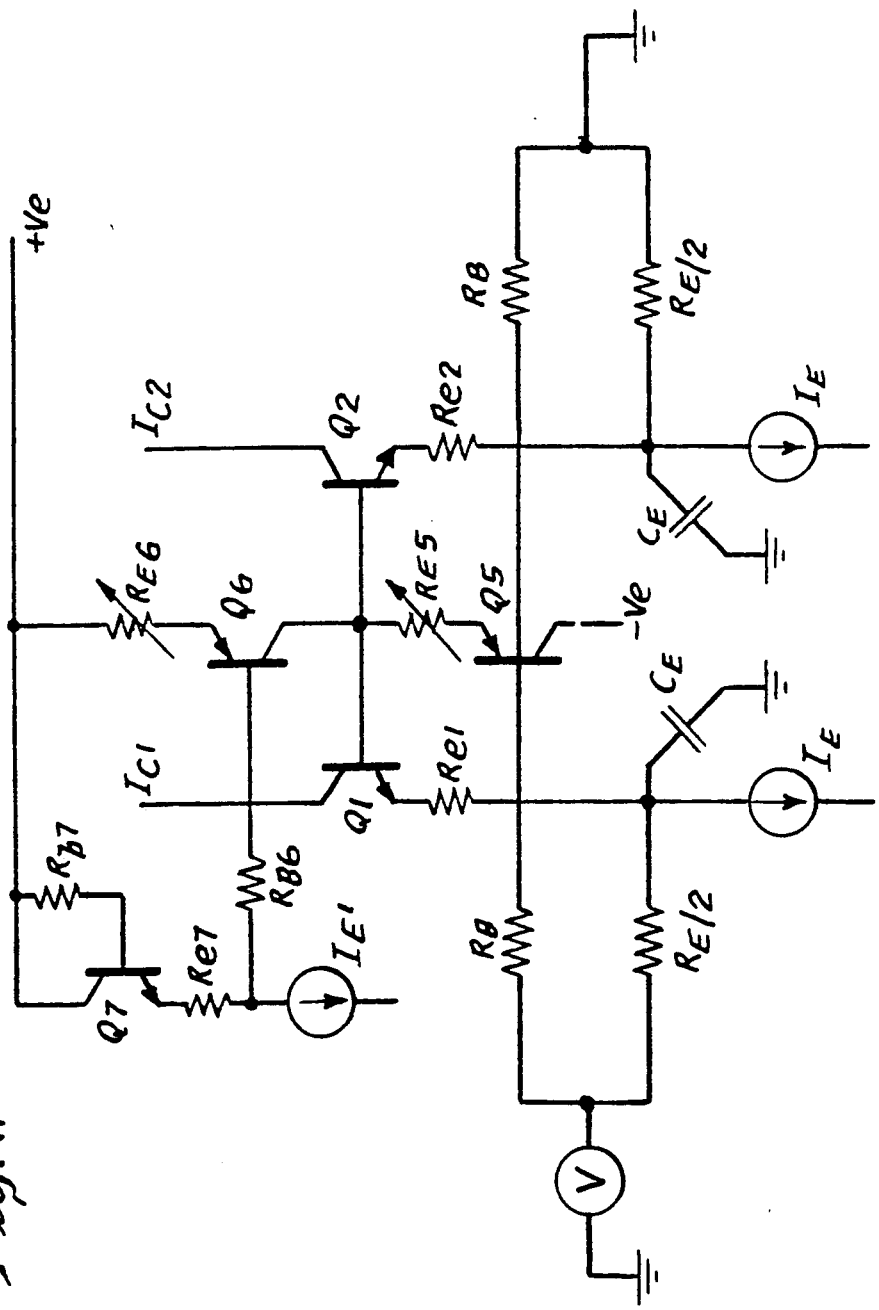
FIG. 7 is a fully-developed circuit for bias-current elimination.

In the FIG. 6 circuit, some of $I_B$ is "lost" (or absorbed by) to the bases of Q1 and Q2; this can be restored by including a suitably-sized resistor $R_{B7}$ in the base of Q7, as shown in FIG. 7. This raises $I_B$ by the needed $2I_E/\beta$. Also, the base current of Q5 flows in the base resistors $R_B$, which slightly raises the voltage at the bases of Q1, Q2. This can be corrected by adding a resistor $R_{B6}$ in series with the base of Q6, which lowers $I_B$ by just the right amount. Finally, $R_{E5}$ and/or $R_{E6}$ can be adjusted (typically by laser-trimming during manufacture) to achieve an even more precise null of the input bias. These refinements all are shown in FIG. 7. This circuit has been shown to maintain a very stable offset null over the full military temperature range in practical embodiments.

It may be noted that the emitter resistors $R_{E1}$ and $R_{E2}$ (FIG. 7) also affect the $-3$ dB corner frequency because they form a transmission pole in conjunction with the emitter parasitic capacitances $C_E$. This can be utilized to deliberately lower the bandwidth, e.g., to about 50 MHz. In realizations of the circuit having generally lower resistances the bandwidth reduction due to the inclusion of these resistors is negligible.

It may also be noted that since the $C_E$'s are initially the reverse-biased collector junctions of current-source transistors, they will vary as the input signal causes the common base node voltage to change. To maintain accurate time constant matching (needed only for accurate control of the HF complementarity), $C_B$ should be fabricated from a similar junction. It may be desirable to add further "real" (discrete) capacitors, of the correct ratio, across the junction-formed capacitors, to increase the time-constants. This lowers the displacement currents in the $C_C$'s of Q1 and Q2, improving the HF complementarity. It also lowers the displacement currents in the collector-base capacitances of the current source transistors, which is of practical concern only in that these currents flow to what is often a common bias line, and thus have the potential for disturbing this line and causing feedthrough of input signals to other parts of a complete IC system.

Even-order distortion is produced by the variation of the current gain of the main pair Q1, Q2 as their collector-base voltage varies with the signal, arising from the finite Early voltage. To quantify this nonlinearity, the following can be said with reference to FIG. 8 of the present application.

Starting with $\sim 1 - 1/\beta$  (5)

and $$\beta = \beta_o(1 + V_C/V_A)$$

where $V_C$ is the collector-base voltage, $V_A$ is the Early voltage and $\beta_o$ is the common-emitter current gain at $V_C=0$, it can be shown that the differential output current $I_o=I_1-I_2$ can be written $$I_o = \frac{V}{R}\left(1 - \frac{1/\beta_o}{1 + (V_P - V/2)/V_A}\right) \quad (7)$$

where $V_P$ is the positive supply voltage, and which reduces to approximately $$I_o = \frac{V}{R}\left(1 + \frac{V}{2\beta_o V_A}\right) \quad (8)$$

when $V_P<<V_A$ (as will invariably be true).

The parabolic distortion is quite evident in this expression, having a magnitude $V^2/2\beta V_A R$. For a typical value of $\beta_o V_A = 12,500$ the peak nonlinearity for a change of 20V in V should be 0.08% FS (full scale).

Figure 9:
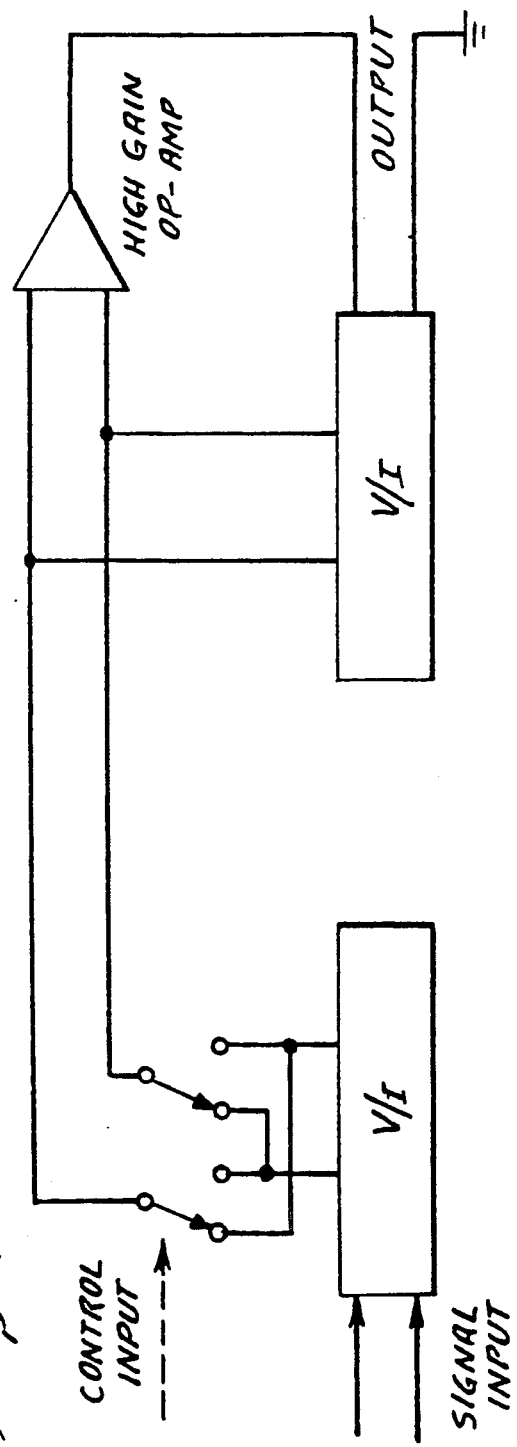
FIG. 9 shows a balanced modulator employing two V-I converters.

FIG. 9 shows a balanced modulator where the even-order distortion is important. Here, the signal input is applied to a first V/I converter whose two outputs can be phase-reversed by a control input. The phase-reversing switch is depicted symbolically in the schematic by mechanical switches, but such switching would in practice be performed by integrated-circuit elements.

The differential current-mode output of the input system of FIG. 9 is nulled by the feedback path around the high-gain op-amp, which is provided by a second V/I converter identical to the first. In such a circuit, all odd-order distortion terms exactly cancel, whatever the state of the switch when (as here) the current gain through the switch is unity. Thus, there is no need to use any odd-order cancellation schemes as discussed above. However, even-order terms only cancel when the switch is in one state, but are doubled when in the other state. Using the results of the calculation above, the parabolic nonlinearity might typically peak to 0.16%.

Darlington-connected transistors can be used for Q1 and Q2 to reduce this nonlinearity. FIGS. 10 through 14 show selected circuits for implementing this basic concept.

Figure 10:
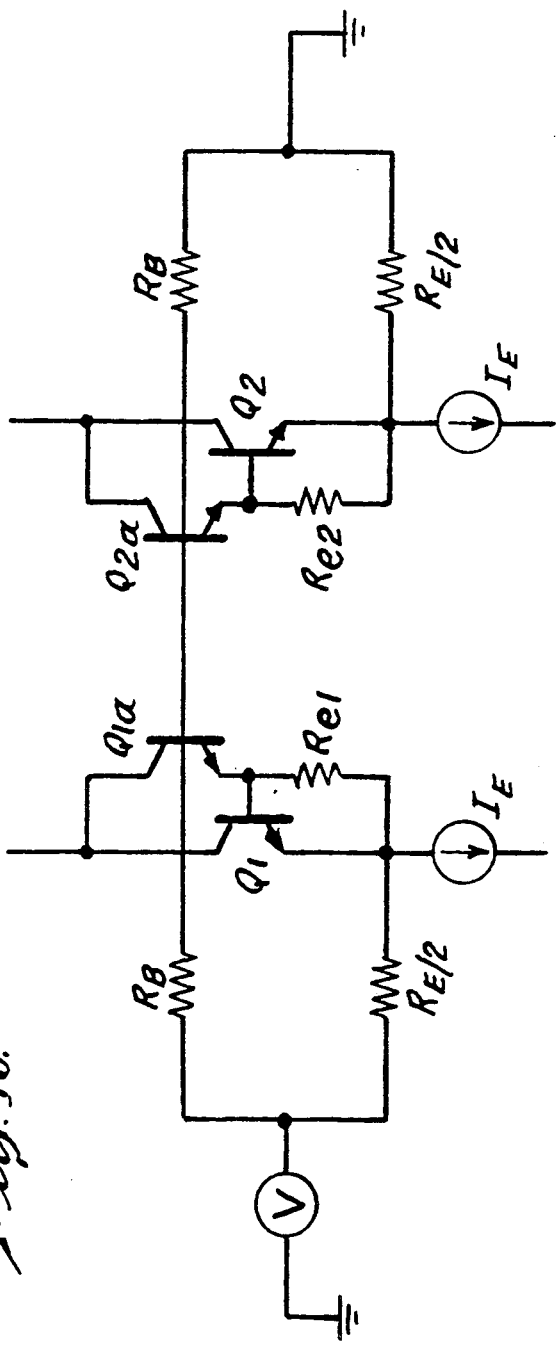
FIG. 10 shows a circuit for reducing even-order distortion in a V-I converter.

The FIG. 10 circuit uses like-polarity (all-NPN) Darlingtons. It is a desirable topology where high-speed PNP transistors are not available. The base currents of Q1 and Q2 are recirculated to their respective collectors by Q1a and Q2a which serve also to couple those bases together as well as couple the resistors $R_B$ to those bases. To define the collector current and Vbe of these transistors, bias currents can be inexpensively obtained by resistors between the base-emitter junctions of Q1 and Q2. Typically, these might have a value of 20kΩ, resulting in a bias current of about 35 μA at room temperature. The slight loss of bias current in Q1 and Q2 can be made up by an increase in the bias currents, $I_E$. More exact, fully-independent current-sources could be used to bias Q1a and Q1b.

HF compensation is introduced as before: a capacitor $C_B$ may be connected from the common base node to a reference node (ground or one of the supplies) and capacitors $C_E$ from the emitters of Q1 and Q2 to this same reference node. The HF balance at the two outputs is excellent and a 3 dB frequency of about 200 MHz has been achieved in practice.

Figure 11:
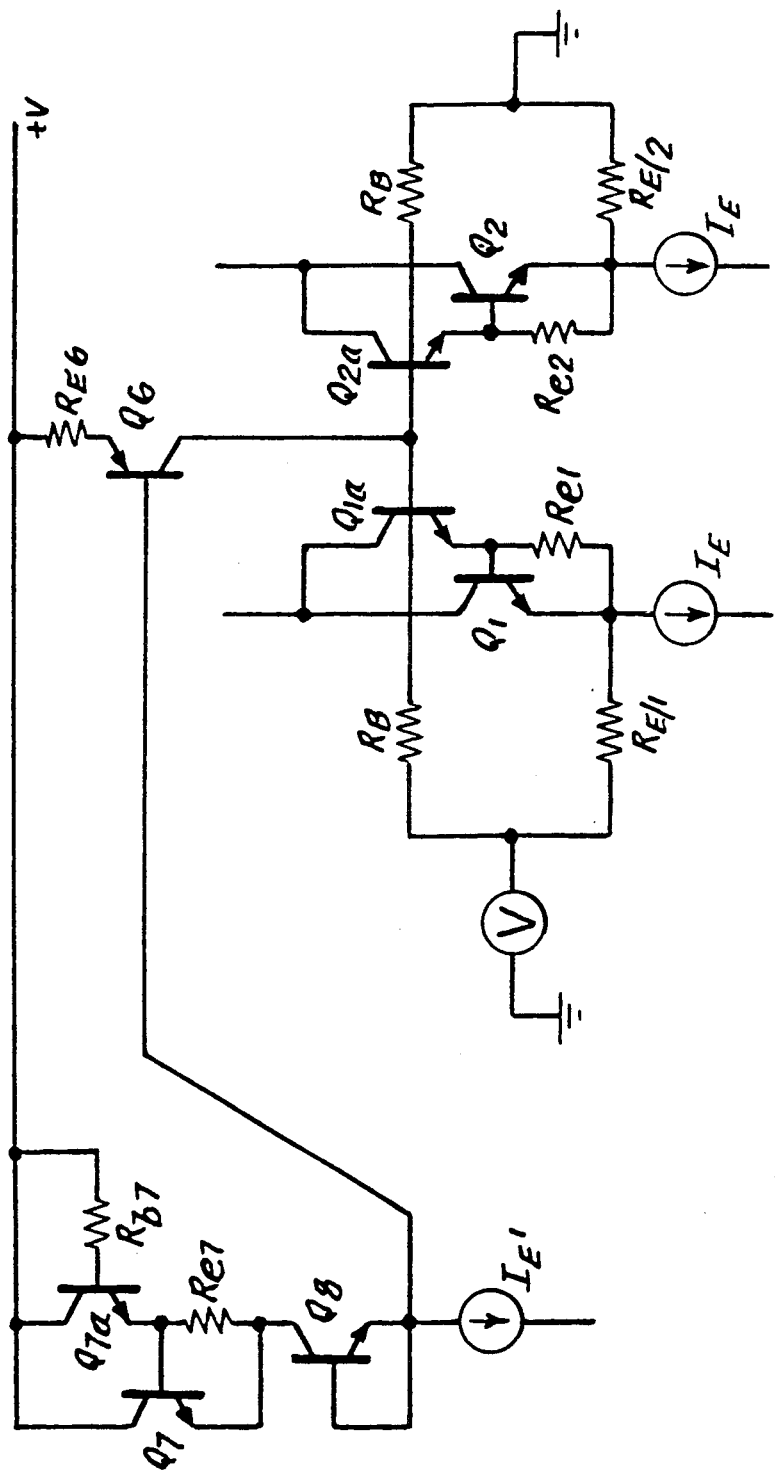
FIG. 11 shows a circuit like FIG. 10 with means to cancel the input bias current.

The input bias current can be eliminated using techniques similar to those presented above. FIG. 11 shows one possible embodiment. Q7 and Q7a replicate the Vbe of Q1/Q1a and Q2/Q2a; Rb7 makes up for the base current lost to Q1a and Q2a. Q8 provides first-order Vbe cancellation for the Vbe of Q6, which supplies a current of just the right amount to the common base node to cancel the input bias current and keep it low over temperature. Alternatively, the earlier scheme using a PNP emitter-follower to bias the common base node can be used; it provides more stable bias nulling over temperature.

Figure 12:
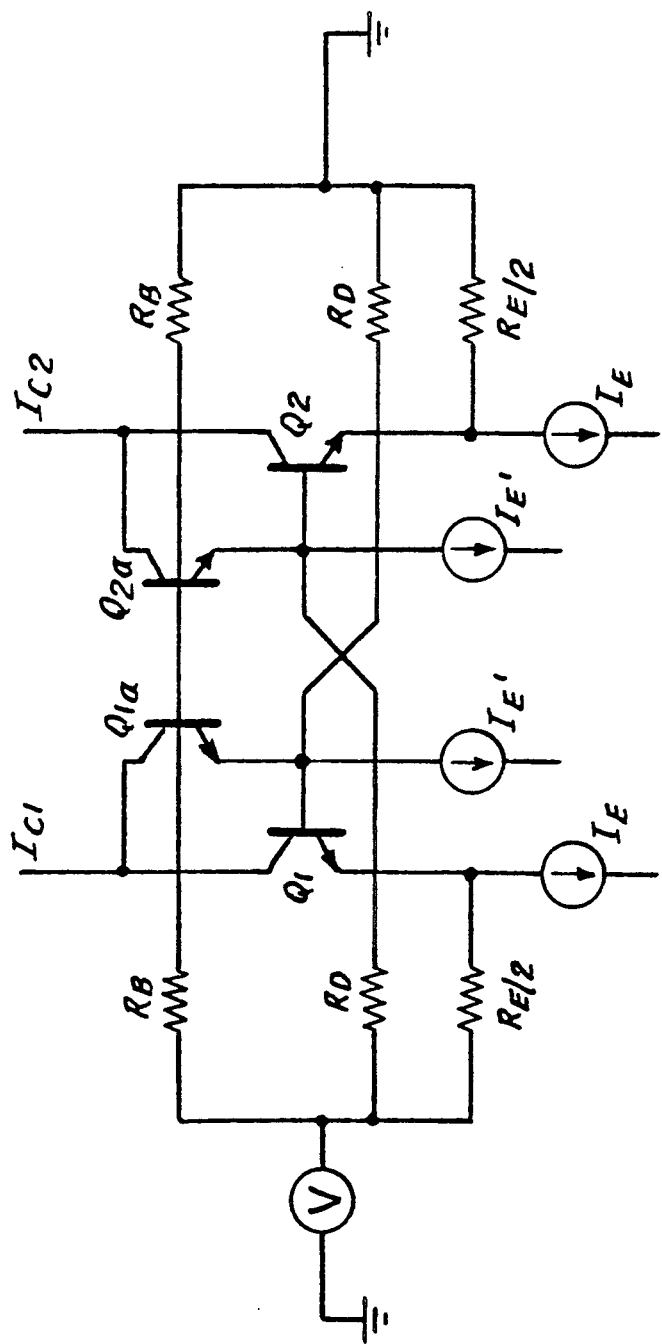
FIG. 12 shows a circuit somewhat like FIG. 10 but with means to cancel odd-order distortion.

Referring to FIG. 12, odd-order distortion can be eliminated by causing the ΔVbe's of Q1a and Q2a (FIG. 11) to cancel the ΔVbe's due to the signal varying the currents in Q1 and Q2. Resistors labeled $R_D$ are chosen to null the odd-order distortion. Three effects need to be dealt with: (1) the bias currents $I_E$, must be raised to supply the signal currents in $R_D$; (2) the effective transresistance is lowered, because the currents in $R_D$ appear at the output in anti-phase with the main signal, so all resistances must be scaled down to correct for the lost "gain"; (3) the input resistance is lower than for earlier circuits.

Figure 13:
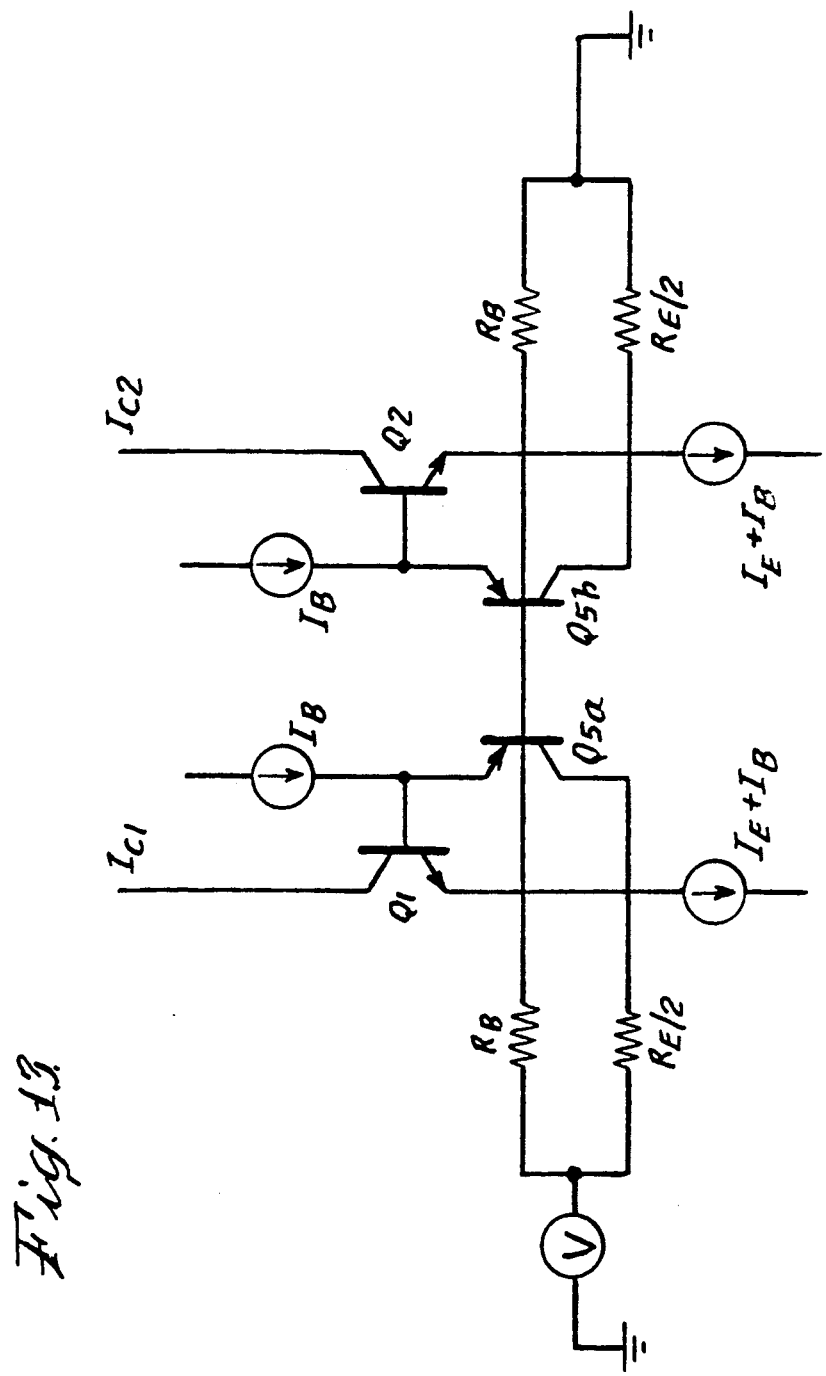
FIG. 13 shows a circuit with means to minimize even-order distortion using folded Darlingtons.
Figure 14:
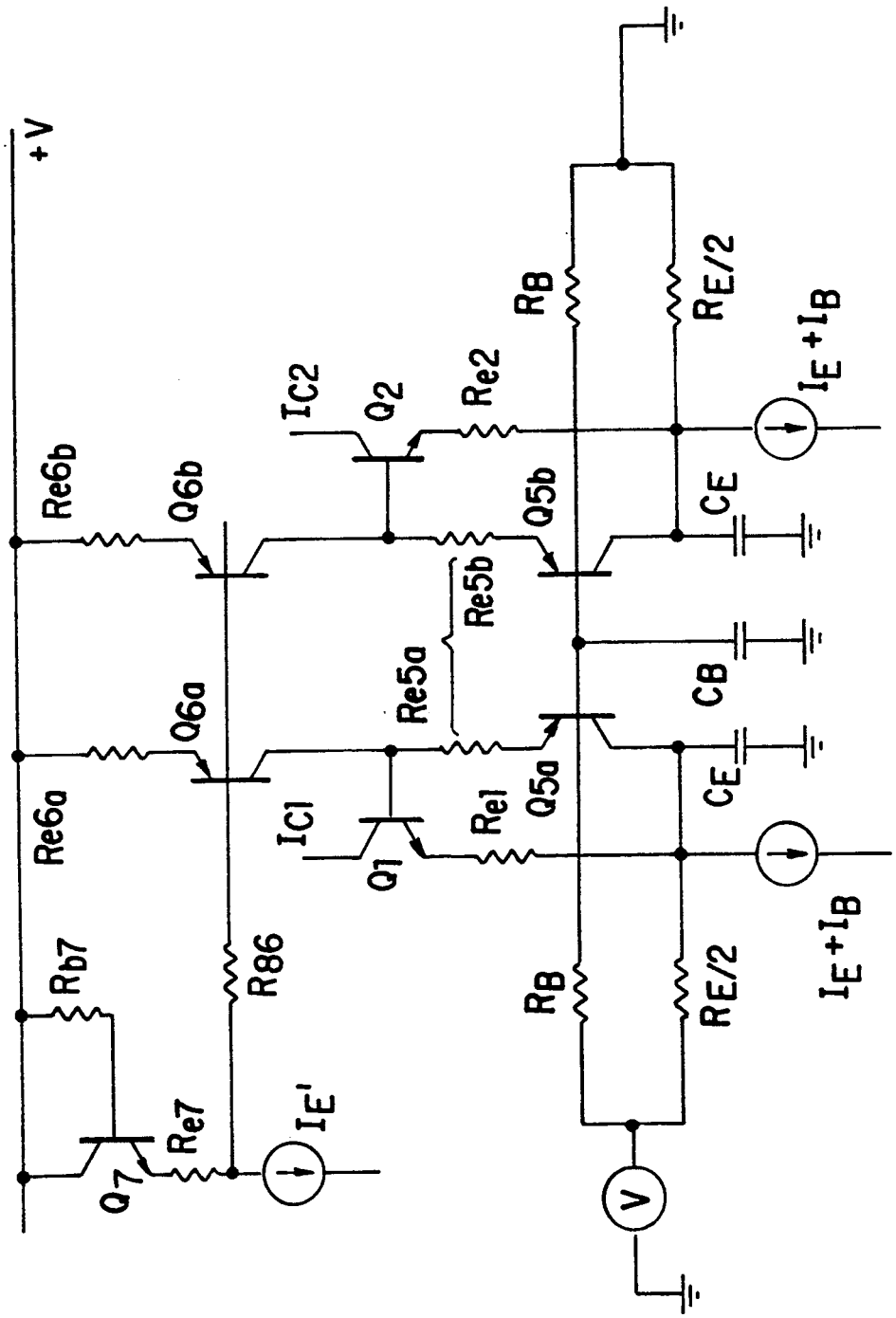
FIG. 14 shows a circuit like FIG. 13 but further developed.

More effective circuit developments can be used to reduce even-order distorion where a high-speed PNP transistor is available, in which case the required alpha increase can be achieved using folded Darlingtons. FIG. 13 shows a simplified form of one general scheme. The basic idea is the same: the "lost" base currents from Q1 and Q2 are recovered by auxiliary transistors (here Q5a and Q5b rather than Q1a and Q2a), but this time delivered not directly to the outputs, but via the emitters of Q1 and Q2. The circuit needs two independent current sources $I_B$ to bias the added transistors. Exact HF compensation can be introduced as in embodiments previously described. Very exact input current cancellation can be achieved by including emitter resistors and using carefully-shaped current sources for $I_B$. FIG. 14 shows a further development of the circuit of FIG. 13.

Figure 15:
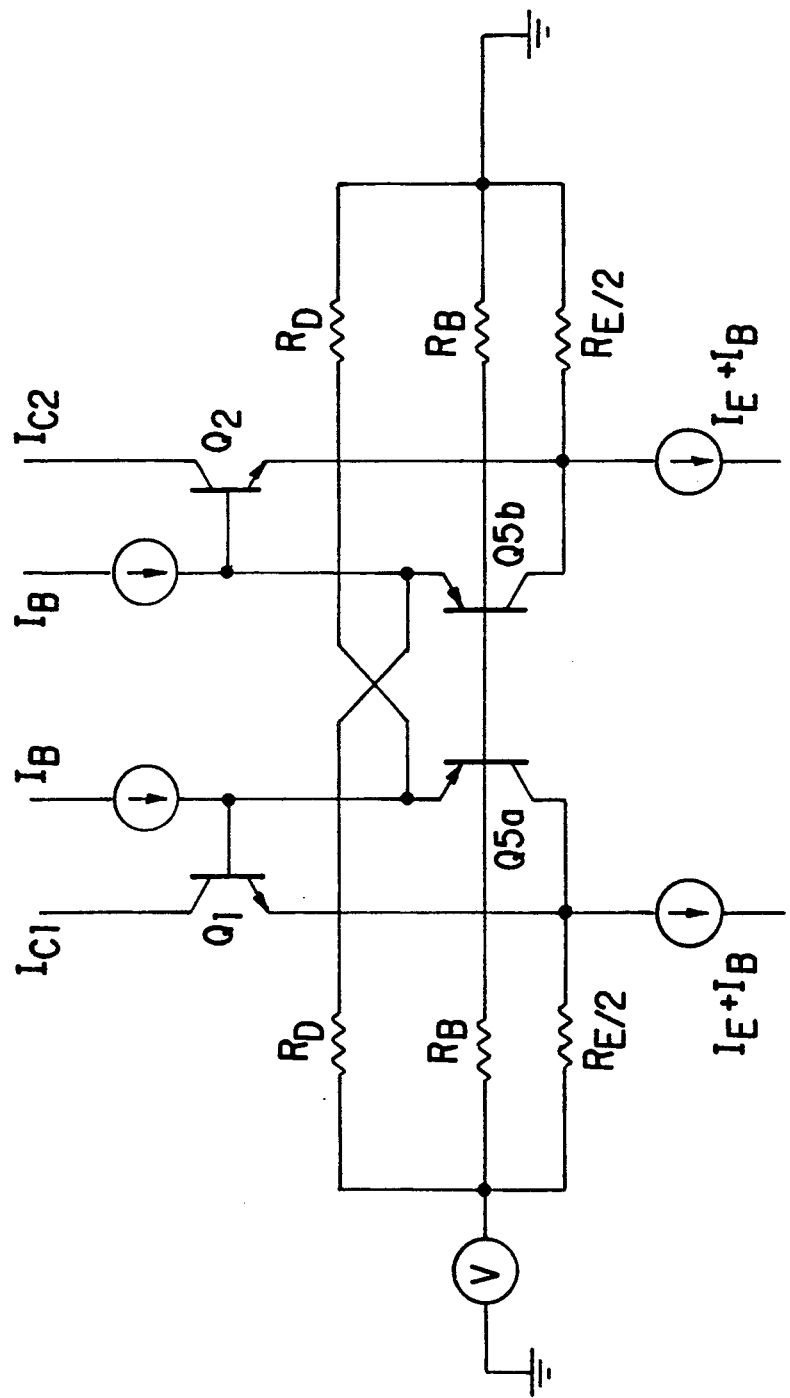
FIG. 15 shows a circuit similar to FIG. 12, with means for reducing odd-order distortion.

Odd-order distortion cancellation can also be introduced by adapting the method shown first in FIG. 12, with similar consequences. FIG. 15 shows the general scheme. Simulation shows a residual even-order nonlinearity about 0.001%.

Figure 16:
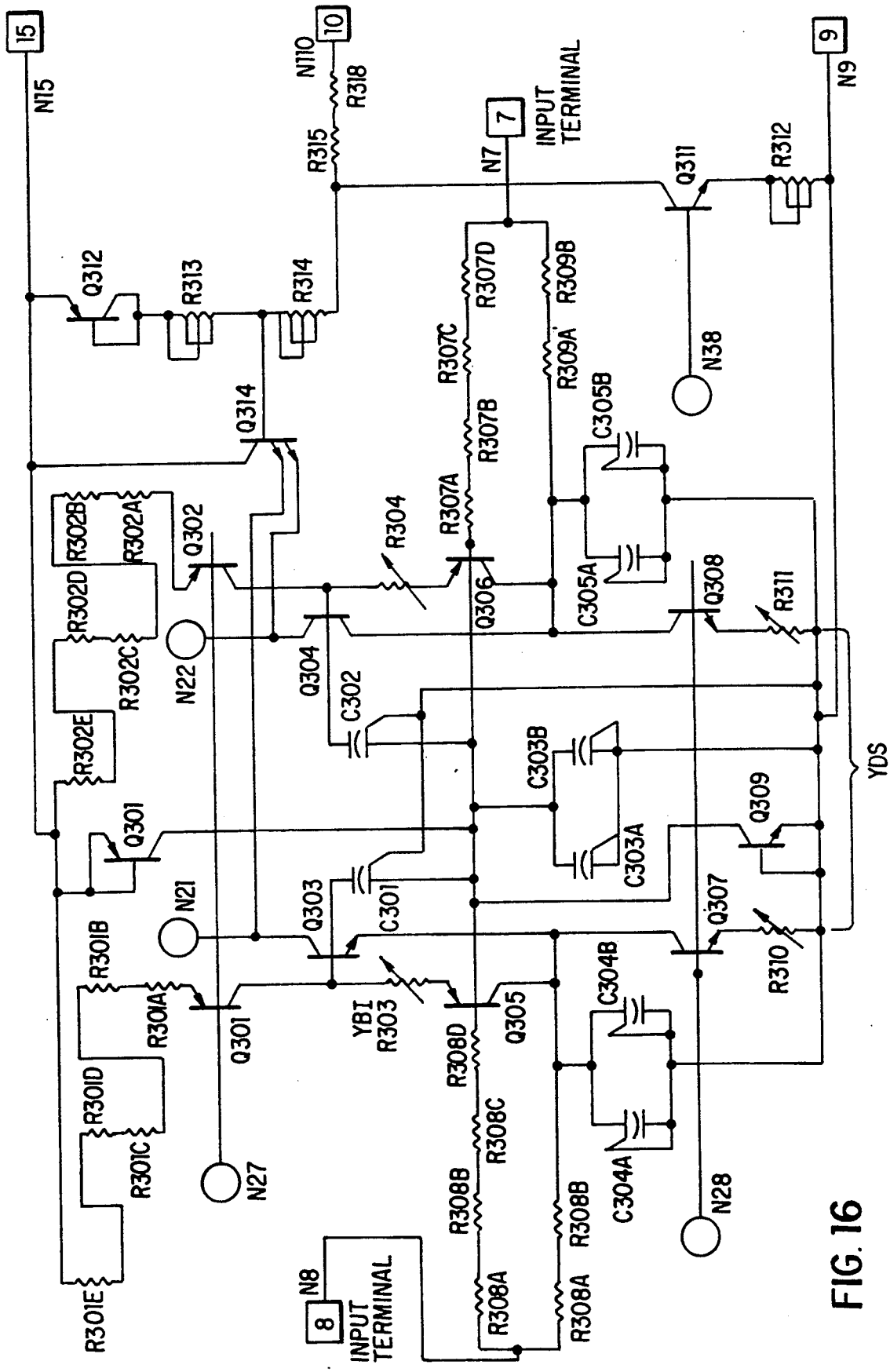
FIG. 16 shows details of a design adapted for commercial use.
Figure 17:
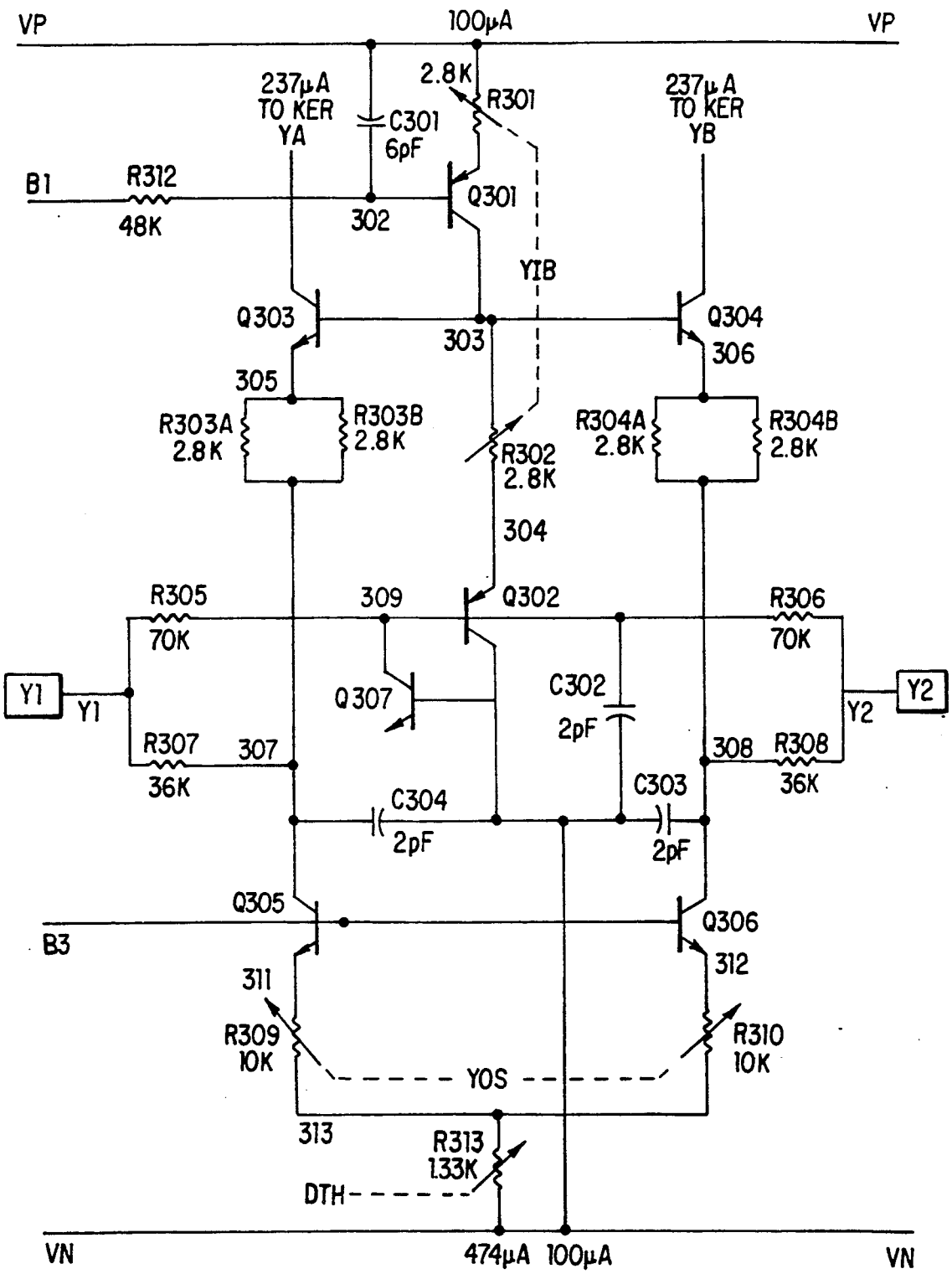
FIG. 17 shows details of another design adapted for commercial use.

FIG. 16 shows the actual schematic of a V/I converter for use in a commercial design of the balanced modulator of FIG. 9. FIG. 17 shows the X-interface of a multiplier designed for commercial use, incorporating improvements described hereinabove.

It will be seen that a number of important benefits are derived from the novel circuitry described above. Almost perfect balance is achieved between the two current outputs, even at high frequencies; that is, the currents are truly complementary to the full bandwidth. The bandwidth for proper operation has been substantially extended. Very low input bias current is made possible where desirable, and over the full temperature range.

Ultra low (0.001%) odd-order (S-shaped) nonlinearity has been achieved using various compensation methods. These methods also increase the accuracy of the transresistance by eliminating the deficit due to junction resistance (typically from an error of 0.4% to essentially zero).

Ultra-low (0.001%) even-order (parabolic) nonlinearity compensation has been achieved using various methods. These methods also increase the accuracy of the transresistance by lowering the alpha error (typically from about 1% to 0.01%).

Accordingly, a designer of V−I converters has available techniques for obtaining virtually any selected requirement for voltage-to-current conversion for almost all practical needs.

Although a number of embodiments have been described herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A V-I converter for use in high-accuracy integrated circuits such as those providing the function of a multiplier, said converter comprising:
   first and second input terminals to receive an input signal;
   first and second output transistors each including base, emitter and collector;
   a first resistor coupled between said first input terminal and the base of said first output transistor;
   a second resistor coupled between said second input terminal and the base of said second output transistor;
   means coupling the bases of said output transistors together;
   third resistor coupled between said first input terminal and the emitter of said first output transistor;
   a fourth resistor coupled between said second input terminal and the emitter of said second output transistor; and
   a capacitor coupled to said means coupling the bases of said first and second output transistors to slow down the voltage swings of said bases.

2. Apparatus as in claim 1, wherein the time constant of the circuit including said capacitor and the electrical resistance associated therewith comprising said first and second resistors is made to be at least approximately equal to the time constant of the circuit including the parasitic emitter capacitance of said transistors and the electrical resistance associated with that parasitic capacitance comprising said third and fourth resistors.

3. Apparatus as in claim 2, wherein said parasitic emitter capacitance is established between the respective emitter electrode and a reference potential;
   said capacitor being coupled between said base coupling means and said reference potential for said parasitic emitter capacitance.

4. Apparatus as in claim 1, wherein said V-I converter is formed in a substrate and said parasitic capacitances are developed by junctions in said substrate;
   said capacitor being created by a junction formed in said integrated-circuit substrate.

5. Apparatus as in claim 4, including discrete capacitors coupled to at least certain of said capacitors formed by junctions in said substrate to increase the total capacitance of each.

6. Apparatus as in claim 5, wherein said total capacitances provide equal time constants for said base-coupled capacitance with its associated electrical resistance comprising said first and second resistors and said parasitic emitter capacitances with their associated electrical resistances comprising said third and fourth resistors.

7. A V-I converter for use in high-accuracy integrated circuits such as those providing the function of a multiplier, said converter comprising:
   first and second input terminals to receive an input signal from a signal source;
   first and second output transistors each including base, emitter and collector;
   a first resistor connected directly between said second input terminal and the base of said second output transistor; and a second resistor connected directly between said second input terminal and the base of said second output transistor, the input signal of said signal source being supplied directly from said input terminals through said resistors to said bases free of intervening circuit elements;
   the bases of said output transistors being coupled together;
   a third resistor coupled directly between said first input terminal and the emitter of said first output transistor; and
   a fourth resistor coupled directly between said second input terminal and the emitter of said second output transistor.

8. A V-I converter for use in high-accuracy integrated circuits such as those providing the function of a multiplier, said converter comprising:
   first and second input terminals to receive an input signal;
   first and second output transistors each having a base, emitter and collector;
   a first resistor coupled between said first input terminal and the base of said first output transistor;
   a second resistor coupled between said second input terminal and the base of said second output transistor;

the bases of said output transistors being coupled together;

a third resistor coupled between said first input terminal and the emitter of said first output transistor; a fourth resistor coupled between said second input terminal and the emitter of said second output transistor;

a third transistor having a base, emitter and collector, and with its base coupled to the emitter of said first transistor;

a fourth transistor having a base, emitter and collector, and with its base coupled to the emitter of said second transistor; and means cross-coupling the collectors of said third and fourth transistors respectively to the collectors of said second and first transistors respectively.

9. Apparatus as in claim 8, including resistor means coupling the emitters of said third and fourth transistors together; and current source means coupled to said resistor means to set the level of current from said third and fourth transistors.

10. A V-I converter for use in high-accuracy integrated circuits such as those providing the function of a multiplier, said converter comprising:

first and second input terminals to receive an input signal;

first and second output transistors each having base, emitter and collector;

a first resistor having one end coupled to said first input terminal;

a second resistor having one end coupled to said second input terminal;

the bases of said output transistors being coupled together;

a third resistor coupled between said first input terminal and the emitter of said first output transistor; a fourth resistor coupled between said second input terminal and the emitter of said second output transistor; and a third transistor coupling the other ends of said first and second resistors to the bases of said output transistors.

11. Apparatus as in claim 10, wherein said first and second transistors are NPN and said third transistor is PNP.

12. Apparatus as in claim 10, including a fourth transistor of PNP type, connected in series with said third transistor; and a fifth transistor of NPN type having base, emitter and collector and connected to said fourth transistor, having base, emitter and collector, to establish a Vbe voltage for said fourth transistor corresponding to the Vbe of said fifth transistor.

13. Apparatus as in claim 12, wherein emitter resistors are connected with all of said transistors.

14. Apparatus as in claim 12, including a resistor connected between the base and the collector of said fifth transistor.

15. Apparatus as in claim 14, including a resistor in series with the base of said fourth transistor.

16. Apparatus as in claim 13, wherein the emitter resistors for said PNP transistors ar trimmable.

17. In a V-I converter for use in high-accuracy integrated circuits such as those providing the function of a modulator or multiplier, said converter being of the type comprising:

first and second input terminals to receive an input signal;

first and second output terminals having base, emitter and collectors;

a first resistor having one end coupled to said first input terminal;

a second resistor having one end coupled to said second input terminal;

the bases of said output transistors being coupled together;

a third resistor coupled between said first input terminal and the emitter of said first output transistor; a fourth resistor coupled between said second input terminal and the emitter of said second output transistor;

a third transistor coupling the other end of said first resistor to the base of said first transistor; and a fourth transistor coupling the other end of said second resistor to the base of said second transistor.

18. Apparatus as in claim 17, wherein said third transistor has its base coupled to said other end of said first resistor, its emitter coupled to the base of said first transistor, and its collector coupled to the collector of said first transistor; and said fourth transistor has its base coupled to said other end of said second resistor, its emitter coupled to the base of said second transistor, and its collector coupled to the collector of said second transistor.

19. Apparatus as in claim 17, including a fifth transistor connected to the coupling between the bases of said first and second transistors to furnish current thereto current.

20. Apparatus as in claim 19, wherein said first, second, third and fourth transistors are NPN type and said fifth transistor is a PNP.

21. Apparatus as in claim 20, including sixth NPN transistor means comprising at least one transistor having base, emitter and collector;

means supplying said one transistor with current;

the emitter of said one transistor being connected to the base of said fifth transistor to control the Vbe thereof, thereby controlling the compensation provided by said fifth transistor.

22. In a V-I converter for use in high-accuracy integrated circuits such as those providing the function of a modulator or multiplier, said converter being of the type comprising:

first and second input terminals to receive an input signal;

first and second output transistors having base, emitter and collectors;

a first resistor having one end coupled to said first input terminal;

a second resistor having one end coupled to said second input terminal;

a third resistor coupled between said first input terminal and the emitter of said first output transistor; a fourth resistor coupled between said second input terminal and the emitter of said second output transistor;

a third resistor coupling the other end of said first resistor to the base of said first transistor; and a fourth transistor coupling the other end of said second resistor to the base of said second transistor.

23. Apparatus as in claim 22, including a fifth resistor coupled between said first input terminal and the base of said second transistor; and a sixth resistor coupled between said second input terminal and the base of said first transistor.

24. Apparatus as in claim 23, including first and second current sources coupled to the emitters of said third and fourth transistors to set the currents therethrough.

25. Apparatus as in claim 22, wherein said first and second transistors are NPN types, and said third and fourth transistors are PNP types;

said third transistor having its emitter coupled to the base of said first transistor, and its collector coupled to the emitter of said first transistor;

said fourth transistor having its emitter coupled to the base of said second transistor and its collector coupled to the emitter of said second transistor.

26. Apparatus as in claim 25, including a fifth resistor coupled between said first input terminal and the emitter of said third transistor; and a sixth resistor connected between said second input terminal and the emitter of said third transistor, thereby to reduce odd-order distortion.

* * * * *